(12) United States Patent
Oh et al.

(10) Patent No.: US 9,060,458 B2
(45) Date of Patent: Jun. 16, 2015

(54) METHOD FOR MANUFACTURING MULTI-LAYER PRINTED CIRCUIT BOARD

(75) Inventors: Yoong Oh, Gyeonggi-do (KR); Cheol Ho Choi, Gyeonggi-do (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 864 days.

(21) Appl. No.: 13/137,352

(22) Filed: Aug. 8, 2011

(65) Prior Publication Data

US 2012/0030942 A1 Feb. 9, 2012

(30) Foreign Application Priority Data

Aug. 9, 2010 (KR) .................. 10-2010-0076426

(51) Int. Cl.
| | |
|---|---|
| H05K 3/02 | (2006.01) |
| H05K 3/10 | (2006.01) |
| H05K 3/00 | (2006.01) |
| H05K 1/00 | (2006.01) |
| H05K 1/03 | (2006.01) |
| H05K 3/46 | (2006.01) |

(52) U.S. Cl.
CPC ......... *H05K 3/4652* (2013.01); *Y10T 29/49155* (2015.01); *H05K 2203/0733* (2013.01); *H05K 2203/1189* (2013.01)

(58) Field of Classification Search
CPC . H05K 3/4652; H05K 3/3452; H05K 1/0393; H01L 2924/01079
USPC ...................... 29/846, 829; 174/250, 254, 255
See application file for complete search history.

(56) References Cited

U.S. PATENT DOCUMENTS

| | | | | |
|---|---|---|---|---|
| 5,268,064 | A | * | 12/1993 | Woo et al. ........................ 216/20 |
| 5,747,098 | A | * | 5/1998 | Larson ............................ 29/846 |
| 6,023,842 | A | * | 2/2000 | Larson ............................ 29/852 |
| 6,048,430 | A | * | 4/2000 | Johnston ........................ 156/233 |
| 6,121,553 | A | * | 9/2000 | Shinada et al. ................ 174/259 |
| 6,317,948 | B1 | * | 11/2001 | Kola et al. ..................... 29/25.42 |

(Continued)

FOREIGN PATENT DOCUMENTS

| | | |
|---|---|---|
| JP | 09-162553 | 6/1997 |
| JP | 2001-015921 | 1/2001 |

(Continued)

OTHER PUBLICATIONS

Korean Office Action issued Sep. 20, 2011 in corresponding Korean Patent Application No. 10-2010-0076426.

(Continued)

*Primary Examiner* — David Angwin

(57) ABSTRACT

A method for manufacturing a multi-layer printed circuit board includes: forming first bumps on one surface of a first copper layer at a predetermined interval; providing, on the first copper layer, an insulating layer through which the first bumps are penetrating; stacking a second copper layer on a top of the insulating layer; forming circuits by patterning the first copper layer and the second copper layer; laminating insulating films on top and bottom surfaces of the insulating layer on which the circuits have been formed; forming second bumps on one surface of a third copper layer and of a fourth copper layer at a predetermined interval; and stacking the third copper layer and fourth copper layer, provided with the second bumps, on the top and bottom surfaces of the insulating films.

7 Claims, 3 Drawing Sheets

(56) References Cited

U.S. PATENT DOCUMENTS

| | | | |
|---|---|---|---|
| 7,293,356 B2 * | 11/2007 | Sohn et al. | 29/852 |
| 8,020,291 B2 * | 9/2011 | En et al. | 29/846 |
| 8,046,914 B2 * | 11/2011 | Sakamoto et al. | 29/852 |
| 8,079,142 B2 * | 12/2011 | Sakamoto et al. | 29/852 |
| 8,156,646 B2 * | 4/2012 | Iwai et al. | 29/852 |
| 2009/0090003 A1 * | 4/2009 | En et al. | 29/846 |
| 2012/0030942 A1 * | 2/2012 | Oh et al. | 29/846 |

FOREIGN PATENT DOCUMENTS

| | | |
|---|---|---|
| JP | 2009-212101 | 9/2009 |
| KR | 10-2009-0017754 | 2/2009 |

OTHER PUBLICATIONS

Korean Office Action issued Apr. 2, 2012 in corresponding Korean Patent Application No. 10-2010-0076426.

* cited by examiner

METHOD FOR MANUFACTURING MULTI-LAYER PRINTED CIRCUIT BOARD

CROSS REFERENCE(S) TO RELATED APPLICATIONS

This application claims the benefit under 35 U.S.C. Section 119 of Korean Patent Application Serial No. 10-2010-0076426, entitled "Method For Manufacturing Multi-Layer Printed Circuit Board" filed on Aug. 9, 2010, which is hereby incorporated by reference in its entirety into this application.

BACKGROUND OF THE INVENTION

1. Technical Field

The present invention relates to a method for manufacturing a multi-layer printed circuit board, and more particularly, to a method for manufacturing a multi-layer printed circuit board capable of improving a deviation in an interlayer insulating distance of a multi-layer substrate by laminating an insulating material in a film type on top and bottom surfaces of a core substrate so as to form interlayer connection between substrates.

2. Description of the Related Art

Recently, as electronic industries are rapidly digitalized and networked, data transmission capacity is suddenly increased and thus, a substrate, which is a basic component for data transmission, is fast developed.

Further, as electronics are small, light, thin, and high functional, the substrate essentially mounted in the electronics needs to be small, light, high performance and high functional.

As described above, in order to manufacture the small and high-functional substrate, the substrate needs to be in a thin condition while maintaining a multi layer. Generally, a substrate including the printed circuit board is manufactured as a multi-layer printed circuit board by manufacturing a copper clad laminate by stacking an insulating adhesive, that is, prepreg between a pair of copper clads, performing a drilling process forming holes on the copper clad laminate by using drill or laser, connecting an interlayer by plating the inside of the hole, and performing a patterning process forming a circuit pattern.

Recently, in order to maintain the thin condition, there has been provided a technology for implementing a thin and small multi-layer printed circuit board by forming a bump using a silver paste without forming the holes for interlayer conduction between the copper clads and performing the plating process and using the bump as a medium of the interlay conduction.

SUMMARY OF THE INVENTION

An object of the present invention is to provide a method for manufacturing a multi-layer printed circuit board having excellent chip mountability while lowering a height of a bump and improving a deviation in an interlayer insulating distance by laminating insulating films on top and bottom surfaces of a core substrate, respectively, having patterns formed on both sides thereof to implement interlayer connection through a bump.

According to an exemplary embodiment of the present invention, there is provided a method for manufacturing a multi-layer printed circuit board, including: manufacturing a core substrate of which both surfaces are patterned; laminating insulating films on top and bottom surfaces of the core substrate; and stacking the copper clads provided with bumps on the top and bottom surfaces of the core substrate, respectively, on which the insulating films are laminated.

The insulating film laminated on the top and bottom surfaces of the core substrate may be made of a low-temperature curing resin film having Tg temperature lower than prepreg (PPG).

The insulating film may be laminated at a thickness of 10 to 30 μm.

The manufacturing of the core substrate of which both surfaces are patterned may include: forming bumps on one surface of a first copper clad at a predetermined interval; penetrating insulating layers through the bumps; stacking a second copper clad on a top of the insulating layer; and forming the circuit patterns by patterning the first copper clad and the second copper clad.

At the stacking of the copper clads provided with the bumps on the top and bottom surfaces of the core substrate, the copper clad provided with the bump may be manufactured by forming the bump on one surface of the copper clad at a predetermined interval and penetrating the insulating layers through the bumps.

DESCRIPTION OF THE PREFERRED EMBODIMENTS

Figure 1:
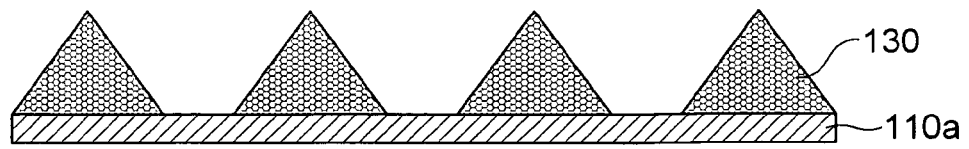
FIGS. 1 to 8 are sequential cross-sectional views according to a method for manufacturing a multi-layer printed circuit board according to an exemplary embodiment of the present invention.

The acting effects and technical configuration with respect to the objects of a multi-layer printed circuit board according to the present invention will be clearly understood by the following description in which exemplary embodiments of the present invention are described with reference to the accompanying drawings.

First, FIGS. 1 to 8 are sequential cross-sectional views according to a method for manufacturing a multi-layer printed circuit board according to an exemplary embodiment of the present invention.

As shown, the multi-layer printed circuit board according to the exemplary embodiment of the present invention may be manufactured by manufacturing a core substrate 100 provided with a circuit pattern 110 by patterning copper clads formed on both sides thereof, laminating an insulating film 200 on top and bottom surfaces of the core substrate 100, respectively, and stacking third and fourth copper clads 310 and 320 each provided with bumps 311 and 321 on the laminated insulating film 200.

In this configuration, the core substrate 100 has a structure of implementing electrical conduction by penetrating the bump 130 through the insulating layer 120, which may connect first and second copper clads 110 and 110b through the bump 130 penetrating through an insulating layer without forming separate holes, vias, or the like, for electrically connecting the first and second copper clads 110a and 110b.

The insulating film 200 is laminated on the top and bottom surfaces of the core substrate 100, respectively. As the insulating film 200, a low-temperature curing resin film having a Tg temperature lower than an insulating material, that is, prepreg, may be adopted.

Figure 7:
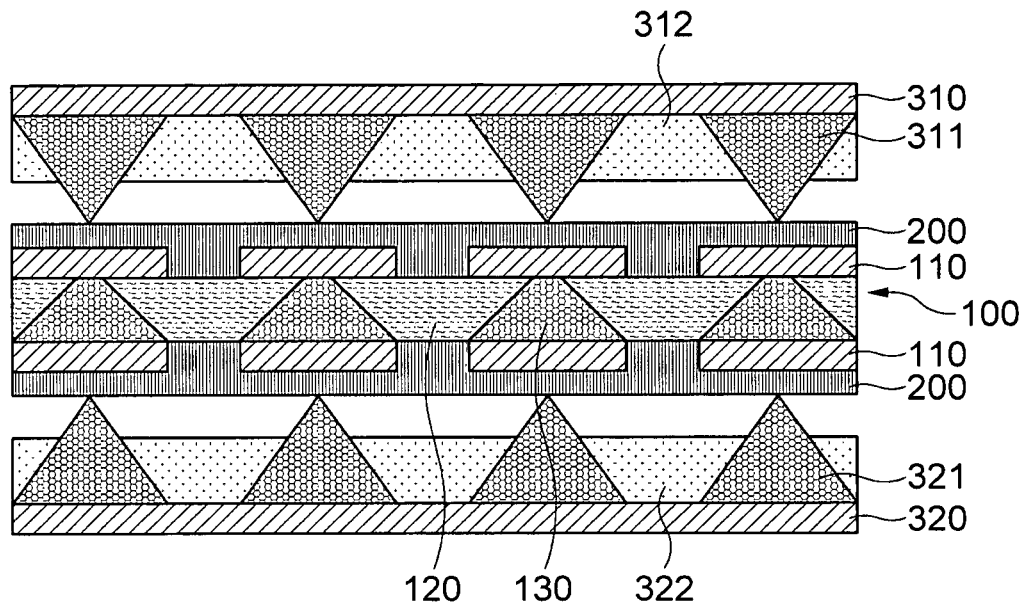
Figure 8:
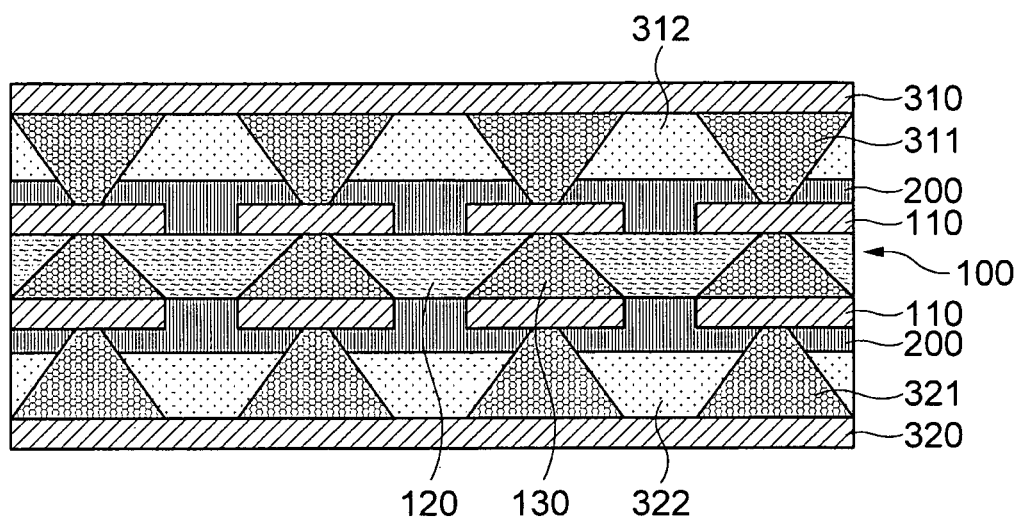

The reason why the insulating film 200 is laminated on the top and bottom surfaces of the core substrate 100, respectively, is that as the thickness of the insulating layers 312 and 322 are thin, the deviation in the interlayer insulating distance may be minimized when the third and fourth copper clads 310 and 320 provided with the insulating layers 312 and 321 are stacked on the top and bottom surfaces of the core substrate 100 as shown in FIG. 7. In this case, the interlayer void is generated due to the lack of an insulating material between layers and the height of the bumps 311 and 321 penetrating the insulating layers 312 and 322 are increased to contact the circuit pattern 110 formed on the core substrate 100 when laminating the third and fourth copper clads 310 and 320 on which the bumps 311 and 321 are formed. As a result, the collapse phenomenon of the bump may occur due to the pressure applied to the bump.

Therefore, in order to compensate for the thin thickness of the insulating layers 312 and 322 formed on the third and fourth copper clads 310 and 320 stacked on the top and bottom of the core substrate 100, when the third and fourth copper clads 310 and 320 are laminated, the collapse of the bumps 311 and 321 is prevented by laminating the insulating films 200 on the top and bottom surface of the core substrate 100, thereby preventing the occurrence of the void that may be generated between the interlayer when being laminated.

In this case, the thickness of the insulating film 200 stacked on the top and bottom surfaces of the core substrate 100 may be applied with the thickness of 10 to 30 μm. When the insulating film 200 is applied below 10 μm, it is difficult to compensate for the thin thickness of the insulating layer when stacking the third and fourth copper clads 310 and 320 having the thin insulating layers 312 and 322 and when the insulating film 200 is applied at 30 μm or more, it is possible to sufficiently compensate for the insulating layer and prevent the collapse of the bump when the third and fourth copper clads 310 and 320 having the insulating layers 312 and 322 are stacked; however, the penetration height of the bump is low such that the circuit pattern 110 formed on the core substrate 100 and the bump 321 of the third and fourth copper clads 310 and 320 may difficult to have the sufficient contact area.

The detailed method for manufacturing a core substrate configured as described above and a multi-layer printed circuit board using the core substrate will be described in more detail below.

As shown in FIGS. 1 to 5, the core substrate 100 may be manufactured by forming the bump 130 on one surface of a first copper clad 110a at a predetermined interval, penetrating through the insulating layer 120 through the bump 130, stacking the second copper clad 110b on the top of the insulating layer 120, and forming the circuit pattern 110 by patterning the first copper clad 110a and the second clad 110b on the top and bottom of the insulating layer 120.

In addition, the method for manufacturing the core substrate 100 may further include laminating the insulating film 200 on the circuit pattern 110 patterned on both surfaces thereof at the predetermined thickness.

First, at the forming of the bump 130, as shown in FIG. 1, the plurality of bumps 130 are formed on one surface of the first copper clad 110a, that is, at a pattern forming position of the final printed circuit board by applying a conductive paste composition thereto by using screen printing, or the like.

Herein, the bump 130 formed in the copper clad 110a is configured as a conductive bump and thus, may be made of a silver (Ag) paste composition and may be made of copper (Cu), tin (Sn), gold (Au), or a low melting point Sn-based alloy, or the like, in addition to a silver paste. Further, as the Sn-based alloy, AuSn, SnSb, Snpb, SnBi, or SnIn, or the like, may be selectively used.

Further, the bump 130 may use a conductive epoxy in a form in which the conductive material, instead of a metal material such as the above-mentioned silver paste, is added to epoxy. In this case, in order to form the bump 130 by printing the silver paste on the first copper clad 110a, the bump may not generally be formed at a desired height by printing the silver paste on the first copper clad 110a once. Therefore, the bump is formed at a predetermined height by primarily printing the silver paste on the copper clad and then, temporarily drying the silver paste. Then, the bump 130 is formed at a desired height by printing the silver paste on the temporarily dried bump again. When the bump is formed at a desired height by repeating the temporary drying process of the silver paste two to three times so as to form the bump, the bump 130 of the conductor is formed by completely drying the silver paste.

Next, when the bump 130 is completely formed on the first copper clad 110a, the insulating layer 120 is formed by penetrating the insulating resin through the bump 130. In this case, the insulating layer 120 may be made of prepreg, ajinomoto build-up film (ABF), or the like, and is made of a thermosetting resin.

Further, the second copper clad 110b is stacked on the top of the first copper clad 110a in which the insulating layer 120 penetrates through the bump 130. Thereafter, the top end of the bump 130 is compressed to the second copper clad 110b by pressing the first copper clad 110a and the second copper clad 110b by a press machine in which the first copper clad 110a and the second copper clad 110b are stacked and the insulating layer 120 is melted/cured by high heat/high pressure through the press machine to bond a pair of copper clads to the insulating layer 120 of the inner layer thereof.

The double-sided printed circuit board is manufactured by manufacturing the above-mentioned core substrate 100 having both sides electrically conducted to each other by electrically connecting the first copper clad 110a and the second copper clad 110b on the top and bottom of the insulating layer 120 through the bump 130 and the first copper clad 110a and the second copper clad 110b are patterned by a process, such as the etching, or the like, to form the circuit pattern 110.

Thereafter, the insulating films 200 may be laminated on the top and bottom surfaces of the core substrate 100, respectively, the insulating film 200 may adopt the low-temperature curing resin film having Tg temperature lower than the insulating material, the prepreg, and the thickness may be controlled within a range of 10 to 30 μm according to the height of the bumps 311 and 321 formed on the third and fourth copper clads 310 and 320 that are stacked on the top and bottom surface of the core substrate 100.

Figure 2:
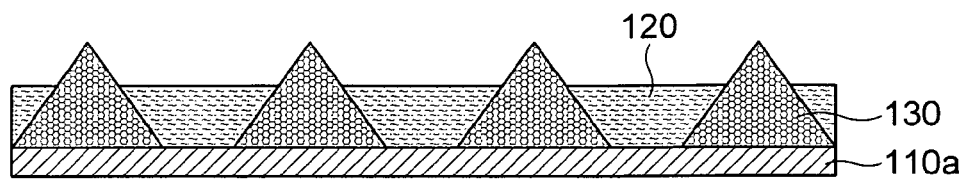
Figure 3:
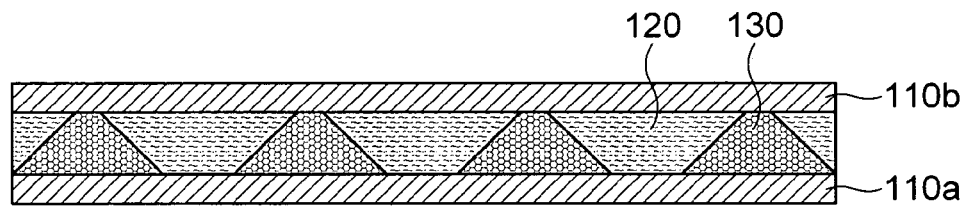
Figure 4:
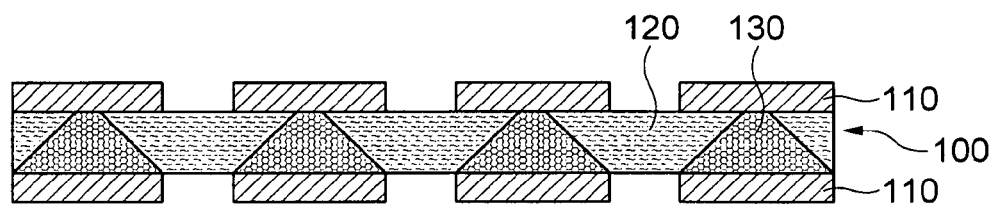
Figure 5:
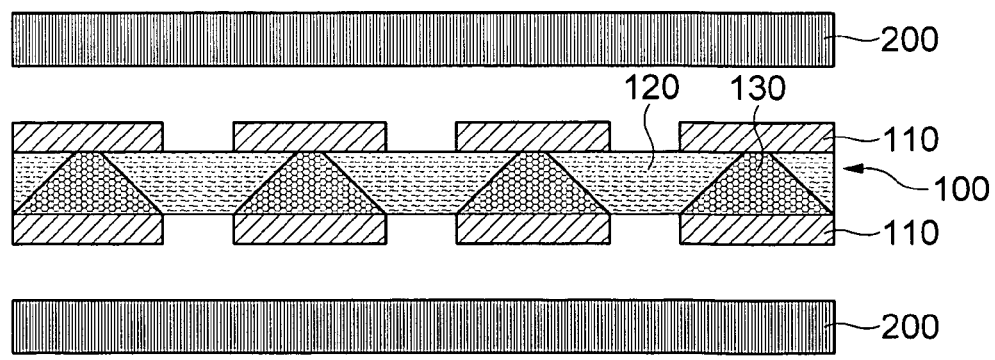
Figure 6:
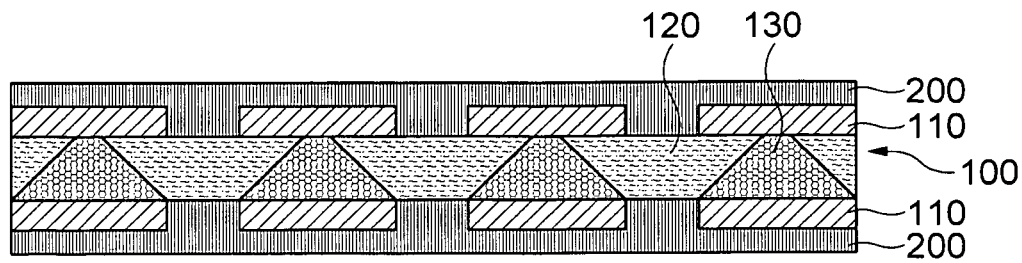

As described above, a multi-layer printed circuit board 500 may be manufactured by individually layering-up the third and fourth copper clads 310 and 320 manufactured by the same process as shown in FIGS. 1 to 3 on the top and bottom surfaces of the core substrate 100 having the insulating film 200 laminated on the circuit pattern 110 of both sides thereof and then, compressing the layered-up third and fourth copper clads 310 and 320.

In this case, one surface of each of the third and fourth copper clads 310 and 320 layered-up on the top and bottom of the core substrate 100 may be provided with the bumps 311 and 321, the insulating layers 312 and 321 may be stacked while penetrating the bumps 311 and 321, and the bumps 311 and 321 formed on the third and fourth copper clads 310 and 320 may be formed at a position corresponding thereto so as to be connected to the circuit patterns 110 formed on the top and bottom surfaces thereof one-to-one.

In the multi-layer printed circuit board according to the exemplary embodiment configured as described above, the thickness of the insulating layers 312 and 322 penetrating through the bumps 311 and 321 of the copper clads 310 and 320 laminated on the top and bottom of the core substrate 100 may be thin and the deviations in the interlayer insulating distance of the printed circuit board may be improved, by stacking the copper clads 310 and 320 on which the bumps 311 and 321 are each formed on the insulating film 200 by laminating the insulating film 200 each formed on the top and bottom of the core substrate 100.

In addition, since the insulating layers 312 and 322 of the third and fourth copper clads 310 and 320 stacked on the top and bottom of the core substrate 100 are thinly formed in order to improve the deviations in the interlayer insulating distance of the printed circuit board, the void generated due to the lack of the insulating material at the time of compressing the third and fourth copper clads 310 and 320 is supplemented by the insulating film 200, thereby fundamentally preventing the void from being generated.

As set forth above, the method for manufacturing a multi-layer printed circuit board according to the exemplary embodiment of the present invention can make the interlayer insulating distance short by the insulation films laminated on both sides of the core substrate, thereby lowering the height of the bump printed on the copper clad.

Therefore, the deviation in the interlayer insulating distance on the substrate can be effectively improved by lowering the height of the bump and the chip mountability may be facilitated according to the improvement of deviation in the interlayer insulating distance.

Further, the exemplary embodiment of the present invention can secure the penetration stability of the insulating material according to the printing of the bump due to the lowered height and can prevent the void from occurring due to the lack of the resin content between the substrate layers.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method for manufacturing a multi-layer printed circuit board, comprising:
    forming first bumps on one surface of a first copper layer at a predetermined interval;
    providing, on the first copper layer, an insulating layer through which the first bumps are penetrating;
    stacking a second copper layer on a top of the insulating layer;
    forming circuits by patterning the first copper layer and the second copper layer;
    laminating insulating films on top and bottom surfaces of the insulating layer on which the circuits have been formed;
    forming second bumps on one surface of a third copper layer and of a fourth copper layer at a predetermined interval; and
    stacking the third copper layer and fourth copper layer, provided with the second bumps, on the top and bottom surfaces of the insulating films.

2. The method according to claim 1, wherein at least one of the insulating films is made of a low-temperature curing resin film having Tg temperature lower than that of prepreg (PPG).

3. The method according to claim 1, wherein at least one of the insulating films is laminated on the circuits at a thickness of 10 to 30 μm.

4. The method according to claim 1, wherein at least one bump among the first and second bumps is made of a conductive bump.

5. The method according to claim 1, wherein at least one bump among the first and second bumps is made of a silver (Ag) paste composition and any one selected from copper (Cu), tin (Sn), gold (Au), and a low melting point Sn-based alloy, in addition to a silver paste.

6. The method according to claim 1, wherein at the stacking of the third copper layer and fourth copper layer, the third and fourth copper layers are manufactured by having the second bumps penetrate the insulating layers.

7. The method according to claim 6, wherein the second bumps formed on the third and fourth copper layers are formed at positions corresponding to the circuits so as to be connected to the circuits one-to-one.

* * * * *